United States Patent
Langmack et al.

[19]

[11] Patent Number: 5,948,960
[45] Date of Patent: Sep. 7, 1999

[54] HTMU TEST HANDLER THROW MEASURING UNIT

[75] Inventors: John Langmack, Tempe; Tom Birk, Chandler; Chris Schroeder, Tempe, all of Ariz.

[73] Assignee: Intel Corporation, Santa Clara, Calif.

[21] Appl. No.: 09/020,661

[22] Filed: Feb. 9, 1998

[51] Int. Cl.⁶ .................................................. G01D 18/00
[52] U.S. Cl. ................................................................ 73/1.88
[58] Field of Search .................................... 73/1.01, 1.79, 73/1.88, 865.8; 33/710, 806, 832, 833, 613, 626, 559, 561

[56] References Cited

U.S. PATENT DOCUMENTS

| | | | |
|---|---|---|---|
| 5,103,572 | 4/1992 | Ricklefs | 33/561 |
| 5,253,428 | 10/1993 | McMurtry | 33/561 |
| 5,269,067 | 12/1993 | Waeldele et al. | 73/1.79 |
| 5,665,897 | 9/1997 | Lippmann et al. | 73/1.88 |

*Primary Examiner*—Robert Raevis
*Attorney, Agent, or Firm*—Blakely, Sokoloff, Taylor & Zafman

[57] ABSTRACT

A handler throw measuring unit (HTMU) for calibrating a test handler that handles an integrated circuit package. The throw measuring unit includes a plurality of pogo pins that are coupled to a base plate and a spring plate. The pogo pins are deflected when a test handler pushes the spring plate. The HTMU has a gauge that is coupled to the spring plate to measure the amount of pogo pin deflection. The amount of deflection can be provided on a numerical readout. An operator can incrementally move the test handler until the readout provides a desired value.

4 Claims, 2 Drawing Sheets

HTMU TEST HANDLER THROW MEASURING UNIT

BACKGROUND OF THE INVENTION

1. Field of the Invention

The present invention relates to a test handler throw measuring unit for testing a test handler that handles an integrated circuit package.

2. Background Information

Integrated circuits are typically assembled into a package that is mounted to a printed circuit board. The package has external contacts such as pins, leads or solder balls that are soldered to the circuit board.

The packages are typically tested before being mounted to the board to screen for defective parts. Many package testers include an automated test handler that pushes the external contacts of a package into a plurality of pogo pins. The pogo pins are coupled to an electrical tester that can perform test routines on the integrated circuit within the package. Some testers include a vacuum handler chuck that holds the package. The chuck is coupled to a motor that pushes the package into the pogo pins.

The tester must be periodically calibrated to insure that the external contacts of the packages are being adequately pressed into the pogo pins. An insufficient pressing force may create electrical opens between the contacts and the pins. Electrical opens generate a false defect indication for the part.

The test handlers are presently calibrated by pressing a package into the pogo pins and visually inspecting the amount of pin deflection. Visual inspection can lead to human error, particularly when the pins only deflect a small amount. It would be desirable to provide a tool that would allow an operator to accurately calibrate a package test handler.

SUMMARY OF THE INVENTION

An embodiment of the present invention is a handler throw measuring unit for calibrating a test handler that handles an integrated circuit package. The handler throw measuring unit includes a plurality of pogo pins that are coupled to a base plate and a spring plate. The unit further includes a gauge that is coupled to the spring plate.

DETAILED DESCRIPTION OF THE INVENTION

One embodiment of the present invention is a handler throw measuring unit for calibrating a test handler that handles an integrated circuit package. The handler throw measuring unit may include a plurality of pogo pins that are coupled to a base plate and a spring plate. The pogo pins are deflected when a test handler pushes against the spring plate. The handler throw measuring unit may have a gauge that is coupled to the spring plate to measure the amount of pogo pin deflection. The spring plate may be a precision machined block which has a known height. The amount of deflection can be provided on a numerical readout. An operator can calibrate the test handler until the readout provides a desired value.

Figure 1:
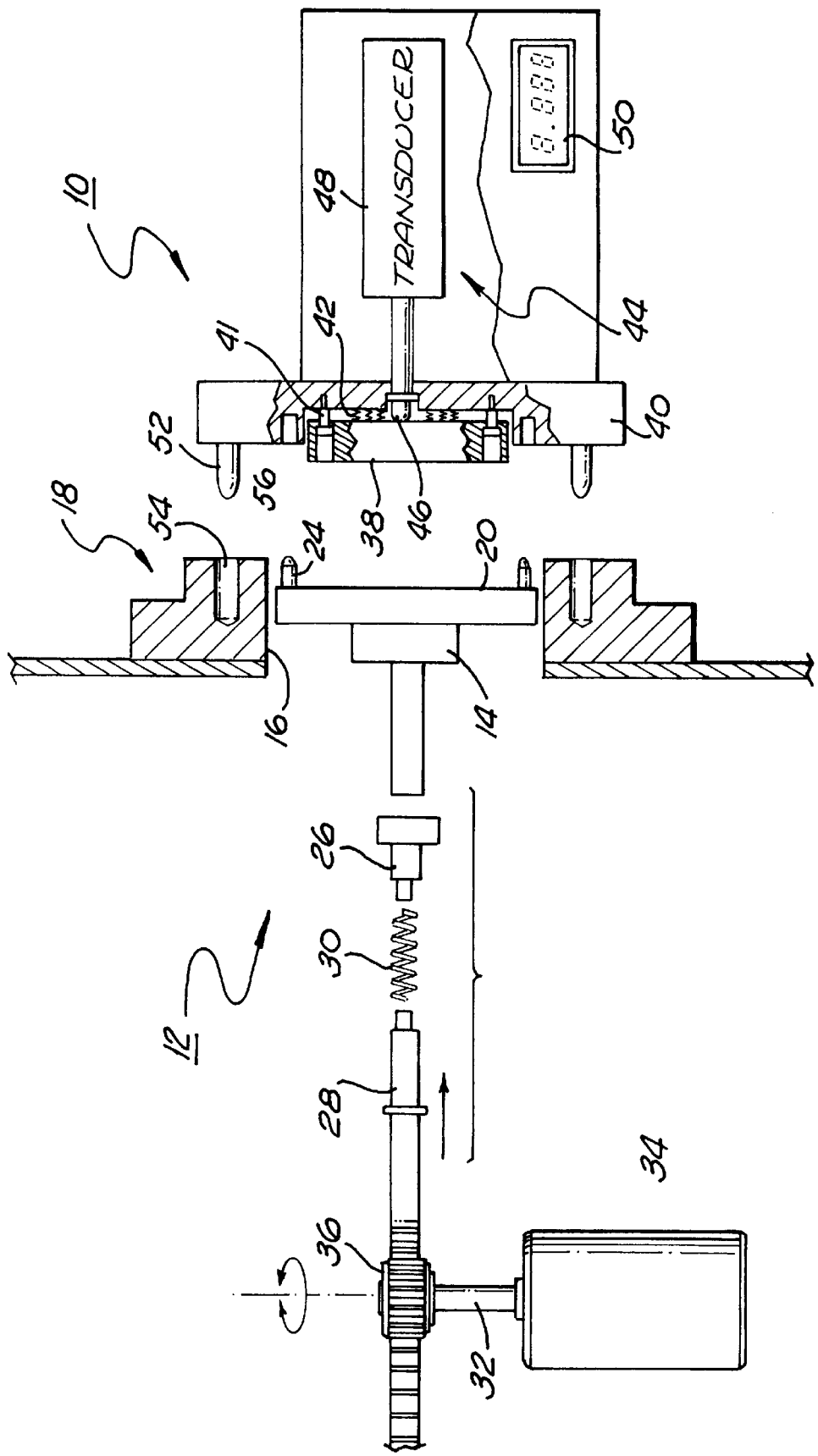
FIG. 1 is a side view of a test handler and a handler throw measuring unit of the present invention.

Referring to the drawings more particularly by reference numbers, FIG. 1 shows a handler throw measuring unit (HTMU) 10 that can be used to calibrate a test handler 12. The test handler 12 includes a handler chuck 14 that extends through an opening 16 of a seal block assembly 18.

The test handler 12 normally holds and presses integrated circuit packages into a test board (not shown) which has a plurality of pogo pins. The test board is coupled to a test system which excites signals and measures responses on an integrated circuit within the package. The handler chuck 14 normally has guide pins 24 which guide the chuck 14 into the test board.

The handler chuck 14 is coupled to a plunger 26. The plunger 26 is coupled to a handler shaft 28 by a spring 30. The handler shaft 28 is coupled to the output shaft 32 of a motor 34 by a gear 36. Rotation of the motor output shaft 32 moves the handler shaft 28 and the handler chuck 14. Movement of the handler chuck 14 can push an integrated circuit package into the test board. The motor 34 typically moves the handler chuck 14 between a fully retracted position and fully engaged position. The motor 34 may be a stepper motor that is coupled to an interface (not shown) which allows an operator to incrementally adjust the stroke of the handler chuck 14.

The handler throw measuring unit 10 includes a spring plate 38 that is coupled to a base plate 40 by fasteners 41. A plurality of pogo pins 42 may be placed between the spring plate 38 and the base plate 40. The pogo pins 42 match the position, size and spring rate of the pogo pins of a test board.

The HTMU 10 also may also have a gauge 44 that is mounted to the base plate 40. The gauge 44 may include a gauge pin 46 that is coupled to the spring plate 38. Both the spring plate 38 and the gauge pin 46 can move relative to the base plate 40. The gauge pin 46 may be coupled to a transducer 48 which provides an electrical signal that corresponds to a movement of the pin 46. The electrical signal may be provided to a numerical readout 50 which provides a numerical value of the gauge pin deflection. By way of example, the transducer 48 may be a linear variable differential transducer (LVDT).

The base plate 40 may have guide pins 52 that can be inserted into corresponding guide holes 54 of the seal block assembly 18 to align the HTMU 12 with the assembly 18. The base plate 40 may also have guide holes 56 which receive the guide pins 24 of the handler chuck 14 to align the HTMU 12 with the chuck 14.

The test handler 12 can be calibrated by initially removing the test board (not shown). The HTMU 10 is mounted onto the handler by aligning the pins 24 and 52 into the corresponding holes 54 and 56, respectively. Mounting bolts (not shown) inserted through the base plate 40 fasten the HTMU to the seal block assembly 18.

Figure 2:
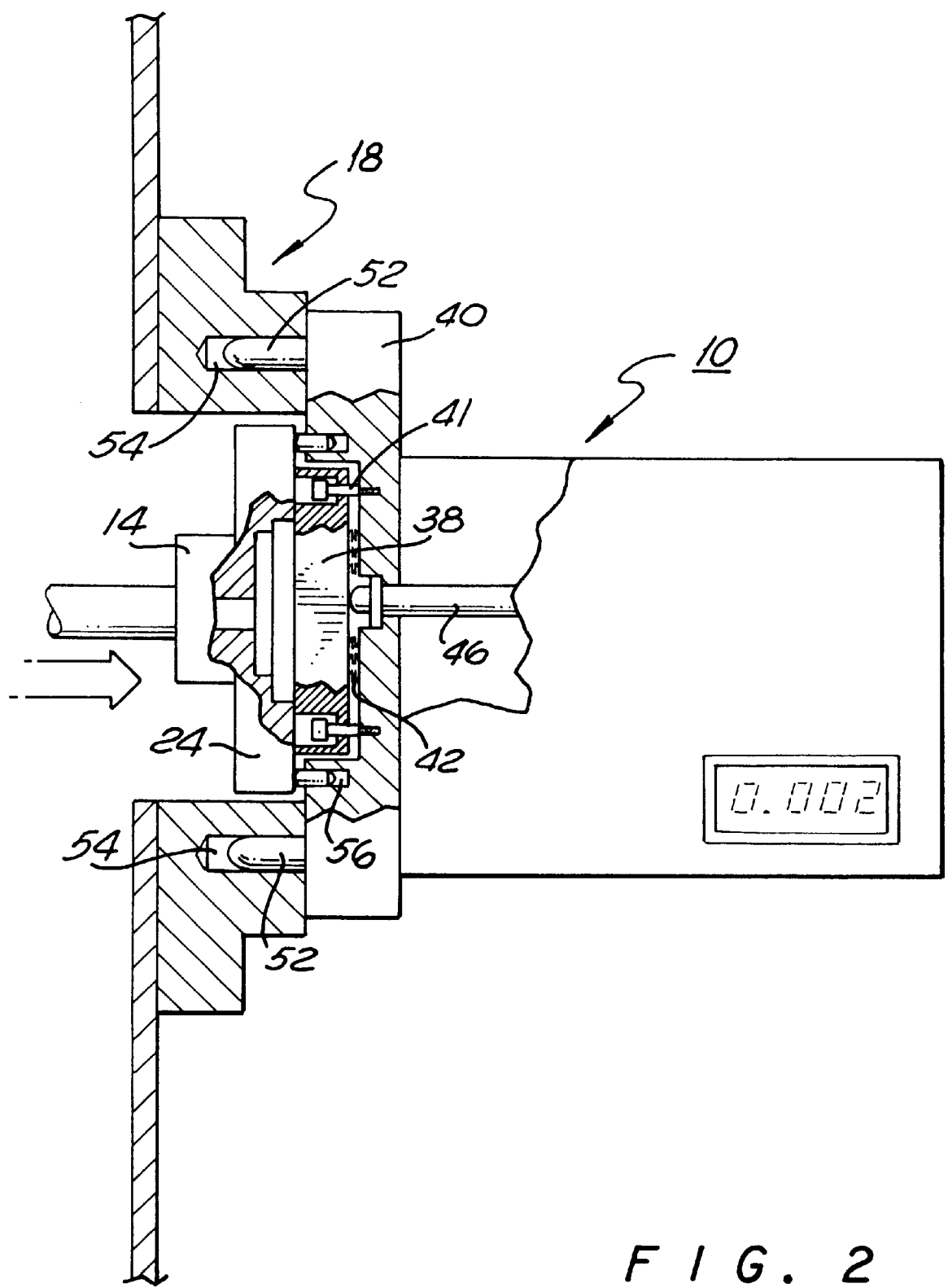
FIG. 2 is a side view showing a calibration package deflecting the handler throw measuring unit.

As shown in FIG. 2, the motor 34 is then activated to move the handler chuck 14 into the spring plate 38. The spring plate 38 deflects the pogo pins 42. Movement of the spring plate 38 also moves the gauge pin 46. The amount of the pin 46 movement is provided on the numerical readout 50. The operator can incrementally vary the output of the motor 34 to adjust the stroke of the handler chuck 14 until the readout provides a desired deflection value. The fully engaged position is then set so that the chuck 14 always moves to the newly set position. After the test handler 12 is calibrated, the HTMU 10 is removed and the test board is then re-mounted onto the handler 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A handler throw measuring unit for calibrating a test handler that handles an integrated circuit package which can be pressed into a test board that has a test pogo pin, wherein the test pogo pin has a spring with a spring rate, comprising:
 a base plate;
 a pogo pin that is coupled to said base plate, said pogo pin has a spring which has a spring rate that is approximately equal to the spring rate of the test pogo pin;
 a spring plate that is coupled to said spring of said pogo pin and which can be pressed into the test handler; and
 a gauge that is coupled to said spring plate.

2. The unit as recited in claim 1, further comprising a numerical readout that is coupled to said gauge.

3. The unit as recited in claim 1, further comprising a guide pin that extends from said base plate.

4. The unit as recited in claim 1, wherein said spring plate is coupled to said base plate by a fastener.

* * * * *